United States Patent [19]
Olofsson

[11] Patent Number: 5,659,284
[45] Date of Patent: Aug. 19, 1997

[54] ELECTRIC FUSE AND PROTECTIVE CIRCUIT

[75] Inventor: Lars-Anders Olofsson, Järfälla, Sweden

[73] Assignee: Telefonaktiebolaget LM Ericsson, Stockholm, Sweden

[21] Appl. No.: 392,490

[22] Filed: Feb. 23, 1995

[30] Foreign Application Priority Data

Feb. 24, 1994 [SE] Sweden .................................. 9400641

[51] Int. Cl.$^6$ ........................................ H01H 85/04
[52] U.S. Cl. ........................ 337/290; 337/297; 337/415
[58] Field of Search ................................ 337/290, 297, 337/255, 415; 29/623

[56] References Cited

U.S. PATENT DOCUMENTS

| | | | |
|---|---|---|---|
| 2,971,138 | 2/1961 | Meisel et al. | 337/290 |
| 3,978,443 | 8/1976 | Dennis et al. | |
| 4,873,506 | 10/1989 | Gurevich | 337/290 |
| 4,973,932 | 11/1990 | Krueger et al. | |
| 5,097,247 | 3/1992 | Doerrwaechter | 337/405 |

FOREIGN PATENT DOCUMENTS

| | | |
|---|---|---|
| 517 306 | 5/1992 | European Pat. Off. . |
| 095 315 | 5/1993 | European Pat. Off. . |
| 36 10 886 | 10/1987 | Germany . |

*Primary Examiner*—Lincoln Donovan
*Attorney, Agent, or Firm*—Burns, Doane, Swecker & Mathis, L.L.P.

[57] ABSTRACT

An electric protective circuit includes an electric fuse and an electric resistance loop connected in series with the fuse, the fuse and loop being mounted on a substrate. The fuse includes a solder that is connected as a resistance in a current series circuit between connection terminals and that melts at elevated temperatures caused by heating of the substrate. The solder is surrounded by a material that protects the solder against oxidation by the surrounding air and completely covers the solder, enabling the solder to contract onto the connecting terminals when it melts and break the current path. The material is temperature-stable in a solid state of normal fuse operating temperatures and includes one or a combination of waxes, resins, thermoplastics, and synthetic fluxes. The material is applied in a region or area surrounding the solder that is delimited by barrier walls that prevent the material from running away from the region. The resistance loop includes current-conducting paths that are mutually connected with bridging elements whose electrical resistance is much lower than the electrical resistance of the current-conducting paths. The resistance loop includes trimming elements for adjusting the resistance of the resistance loop.

5 Claims, 3 Drawing Sheets

ELECTRIC FUSE AND PROTECTIVE CIRCUIT

The present invention relates to the field of electric protective circuits of the kind which include an electric fuse and an electric resistance loop connected in series with the fuse, said fuse and loop being mounted on a substrate. The protective circuit may advantageously be used in line interface boards of telecommunications systems.

BACKGROUND

The telephone lines of telecommunications systems are connected to telephone exchanges or switching centres through the medium of a so-called line interface board which includes such line functions as speech reception and transmission, monitoring the lifting of telephone receivers, and the transmission of telephone ringing signals. Since the line interface boards include electric circuits which are seated in the immediate proximity of the telephone lines, it is necessary to protect the electric circuits against those voltages that can be induced on the lines by lightning strikes, and also against those voltages that can be generated by direct short circuits in the voltage supply power network.

The requirements placed on protective functions against overvoltages will vary from country to country, in dependence on climate, installation rules, etc. For instance, in certain countries power cables and telephone cables are installed in one and the same installation duct. Short circuits can occur between the power lines and the telephone lines in unfortunate circumstances.

The hazardous overvoltages that are liable to enter via the telephone lines can be divided into three different groups, in accordance with the following:

1. Lightning-induced pulses which most often have a duration of less than one millisecond and a peak voltage which is most often less than 2,500 volts.

2. Short circuits between power lines and telephone lines with voltages between 220 volts and 600 volts over a time period of several hours.

3. Internal short circuits in the telecommunication system supply voltage of 50 volts over a time period of some hours.

Gas discharge tubes, thermistors and resistors are examples of the fuses used to protect against such overvoltages.

The requirements specified are different for different types of overvoltage. In the case of overvoltages which fall in the first group, i.e. lightning-induced pulses, the circuits must be capable of withstanding up to about 100 pulses without being damaged. In the case of the overvoltages which fall in the second group, short circuits between power lines and telephone lines, one of the components or circuits present on the line interface board shall function as a fuse and break the current path before there is time for the board or other parts of the telecommunication system to be seriously damaged. When sufficient heat is generated, the component that functions as a fuse will crack, therewith breaking the current path and introducing the desired safety function. In the case of overvoltages that fall in the third group, i.e. internal short circuits in telecommunication system voltage supply circuits the component shall be capable of remaining undamaged over a given limited time period but shall also initiate a safety function should the short circuit prevail over a longer time period. Less heat will be generated in the component in this case, since the short-circuiting current is lower. However, if heat is generated over a longer time period, the component will be heated to an extent which causes the desired safety function to come into effect.

It is known that certain overload cases can be managed with a fuse-functioning resistor. U.S. Pat. No. 3,978,443 teaches an overload protector in the form of a resistor which is connected between substrate-mounted connection plates. When a sufficiently large current flows through the resistor, the resistor and the substrate become heated. The substrate is made of a brittle material, for instance a ceramic material, and will therefore crack at high temperatures. The fuse is constructed so that the substrate will crack, wherewith the current path is broken and the desired safety function is initiated.

It is also known to produce a fuse with the aid of a small metal tab or a small piece of solder-alloy wire which is soldered firmly between two solder terminals in a resistance network. The wire or tab will conveniently be comprised of a low melting solder. As the substrate in the resistance network is heated by the heat emitted from the resistors, the solder will melt and contract onto the solder terminals, therewith breaking the current path and providing the desired safety function.

One problem that arises with this solution is that the solder provided in the fuse will oxidize when heated. When the nature of the load is such that the solder is heated to a relatively high temperature over a relatively long period of time, the solder will oxidize to such an extent as to prevent the desired safety function from coming into effect. This is because the oxide scale or film that surrounds the solder is so strong as to prevent the molten solder from contracting onto the solder terminals, therewith excluding initiation of the desired safety function. In principle, this means that the oxide scale results in the solder retaining its initial form when heated. It is true that the actual solder will melt, but since the solder will not contract the circuit will not be broken.

U.S. Pat. No. 4,973,932 teaches an electric fuse. The fuse includes a short-circuit fuse and a fusible cut-out. The fusible cut-out is partially covered with a thermoplastic material which when overloading occurs penetrates the cavities that appear in the solder in the fuse, wherewith the current path is broken as a result of plastic penetrating the fuse.

SUMMARY

The object of the present invention is to provide a protective circuit which includes a fuse which protects against overvoltages, or excess voltages, and which is not receptive to the oxidizing effect of the air, and a resistance loop which is connected in series with the fuse and which also protects against induced pulses, such as lightning-induced pulses for instance. This object is achieved with a fusible cut-out which incudes a solder that is protected against the oxidizing effect of air at elevated temperatures with the aid of a temperature-stable material and by supplementing the fuse with a resistance loop which absorbs the energy in the induced pulses, therewith dampening the pulses.

The temperature-stable material also has the property of a weak flux, so that the oxide formed on the solder metal at room temperature will break down. The material is deposited on the fuse so as to form a protective coating on the solder alloy. A barrier is also provided in the form of walls around the fuse, so as to prevent the temperature-stable material from running away from the area around the fuse.

One of the advantages afforded by the invention is that the fuse will not oxidize, therewith providing a highly reliable fuse. Another advantage is that the protective circuit can be integrated on a circuit board.

The invention will now be described in more detail with reference to a preferred exemplifying embodiment thereof and also with reference to the accompanying drawings.

DETAILED DESCRIPTION

Figure 1:
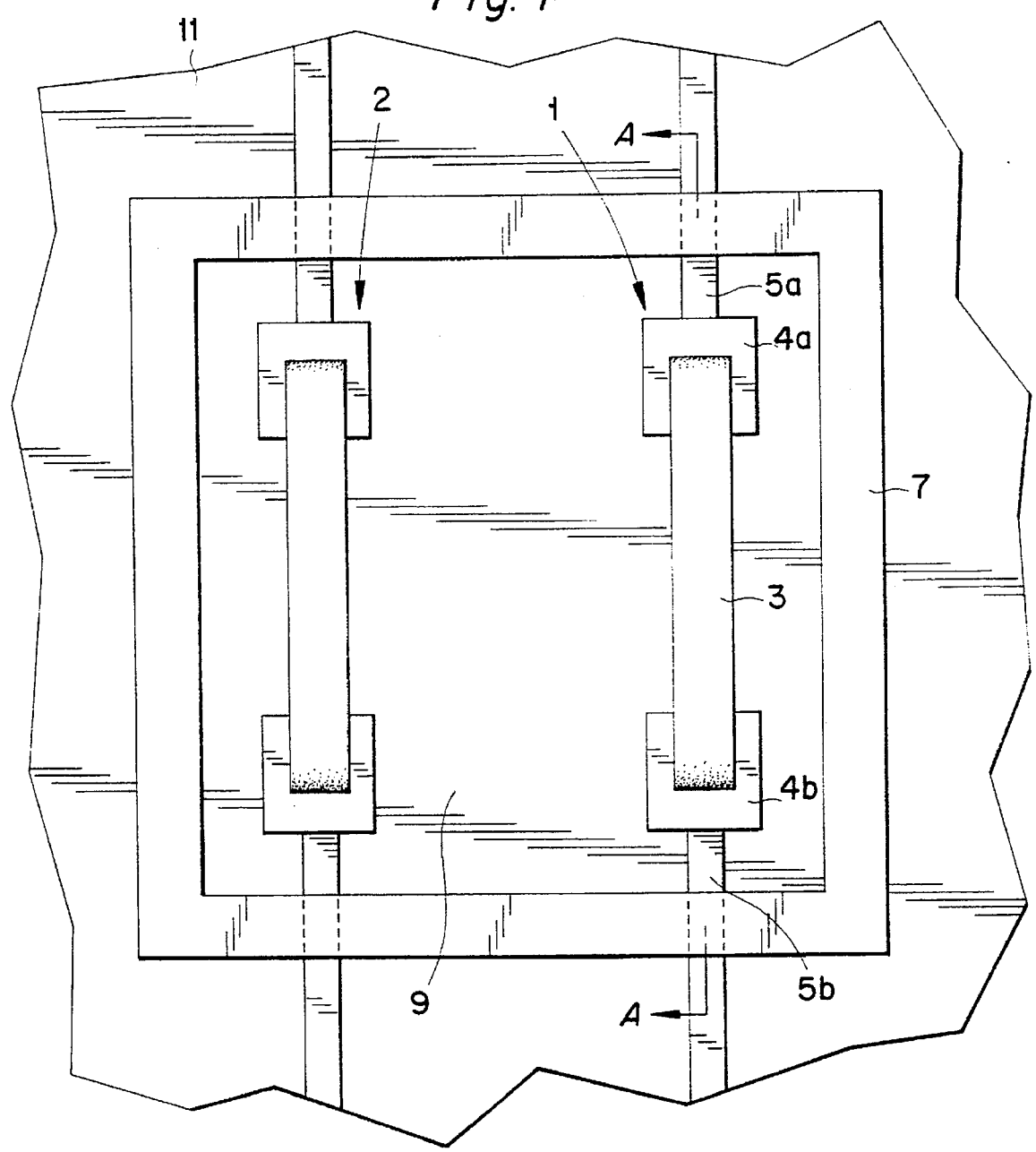
FIG. 1 is a view from above of a fuse arrangement included in an inventive protective circuit.

FIG. 1 shows a fuse arrangement which includes two mutually identical fuses 1 and 2. The fuse arrangement is mounted on a substrate 11 and the fuse arrangement may be used advantageously in telecommunications systems. Because a telephone line includes two physical conductors, the fuse is duplicated as shown in FIG. 1. For the sake of simplicity, only the fuse 1 shown to the right in FIG. 1 will be considered in the following.

The actual fuse is comprised of solder 3 which connects between two connection terminals 4a and 4b. The connection terminals 4a, 4b are, in turn, connected to current conducting paths 5a, 5b. When the fuse is connected in an electric circuit, an electric current will, for instance, pass from the conductor path 5a, through the corresponding connection terminal 4a, through the solder 3 and then through the connection terminal 4b to the other, 5b, of the current-conducting paths. When the solder 3 is heated sufficiently, the solder will melt and contract onto the connection terminals, therewith breaking the current path and providing the desired safety function. Also shown in the Figure is a barrier wall 7 which surrounds the solder and defines a region 9. The barrier wall 7 and its function will be described in more detail below with reference to FIG. 2. The solder may have the form of a metal plate and may comprise different solder alloys. A suitable alloy will include 96.5% tin and 3.5% silver. However, the solder is preferably a special solder-paste mixture which is sintered to form a metallic electrically conductive fuse at the same time as the mixture is soldered firmly to the connection terminals. One of the advantages afforded by this construction is that the sintered fuse will contain pores in which flux can be enclosed, therewith assisting in breaking down oxide film on the solder and improving the safety function of the fuse, as described below.

Figure 2:
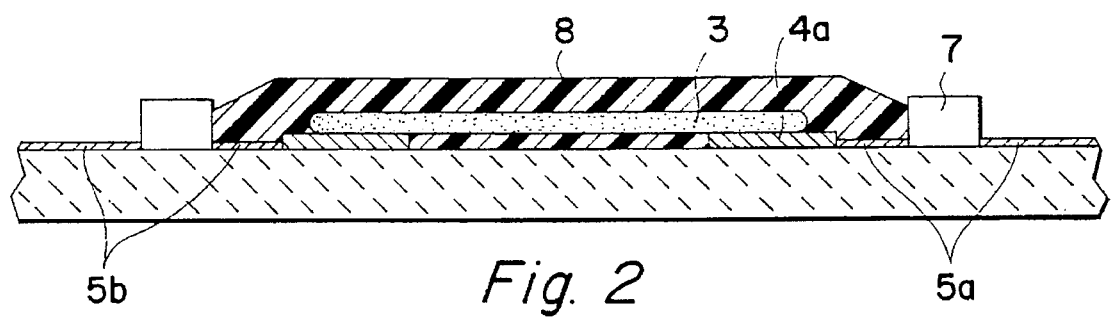
FIG. 2 is a sectional view of the fuse arrangement taken on the line A—A in FIG. 1.

FIG. 2 is a sectional view of the fuse arrangement shown in FIG. 1, taken on the line A—A in FIG. 1. As shown in FIG. 1, the solder is surrounded by a barrier wall 7 which defines the region or area 9 around the fuse. As shown in FIG. 2, a temperature-stable material 8 is deposited in the region 9 defined by the barrier wall 7, wherein the solder is completely covered with this material. The material 8 has an anti-oxidizing effect at elevated temperatures, in other words it protects against the oxidizing effect of air at temperatures above room temperature. The material also has the property of a weak flux, so that it is able to break down the oxide that is formed on the solder at room temperature. Suitable materials in this regard are organic substances which are solid at normal operating temperatures and which become liquid or fluid at elevated temperatures. Materials of this kind are found, for instance, within the following groups: waxes, resins, thermoplastics and synthetic fluxes. A preferred flux is a thermoplastic resin with the base ethylene vinyl acetate.

The material 8 is in a solid state at normal operating temperatures, so that the material will not run away from the solder or be vapourized. When a high current passes through the current-conducting paths and the fuse 1 becomes hot as a result, the material 8 is also heated and therewith becomes more fluid. The barrier wall 7 prevents the anti-oxidizing material 8 from flowing away from the region 9. The amount of material 8 deposited in the region 9 will be sufficient to ensure that the solder will definitely be covered with the material 8 totally and completely.

In the case of telephone stations or switching centres, for instance, fuses and protective circuits are intended to remain in place for long periods of time without being replaced. It is possible that during this time, the fuse will have oxidized to such an extent as to form an oxide scale or film over the solder, this oxide scale being sufficiently strong to prevent the desired safety function from coming into effect despite the fuse having been subjected to temperatures above or considerably above normal operating temperatures. The oxide scale would prevent the solder from contracting into spheres on the connection terminals, wherein the current-conducting path would remain intact and the desired safety function would be excluded. The problem of the solder oxidizing and gradually being covered by an oxide scale of such strength as to exclude the desired safety function can be prevented by covering the solder with an anti-oxidizing material 8.

Figure 3:
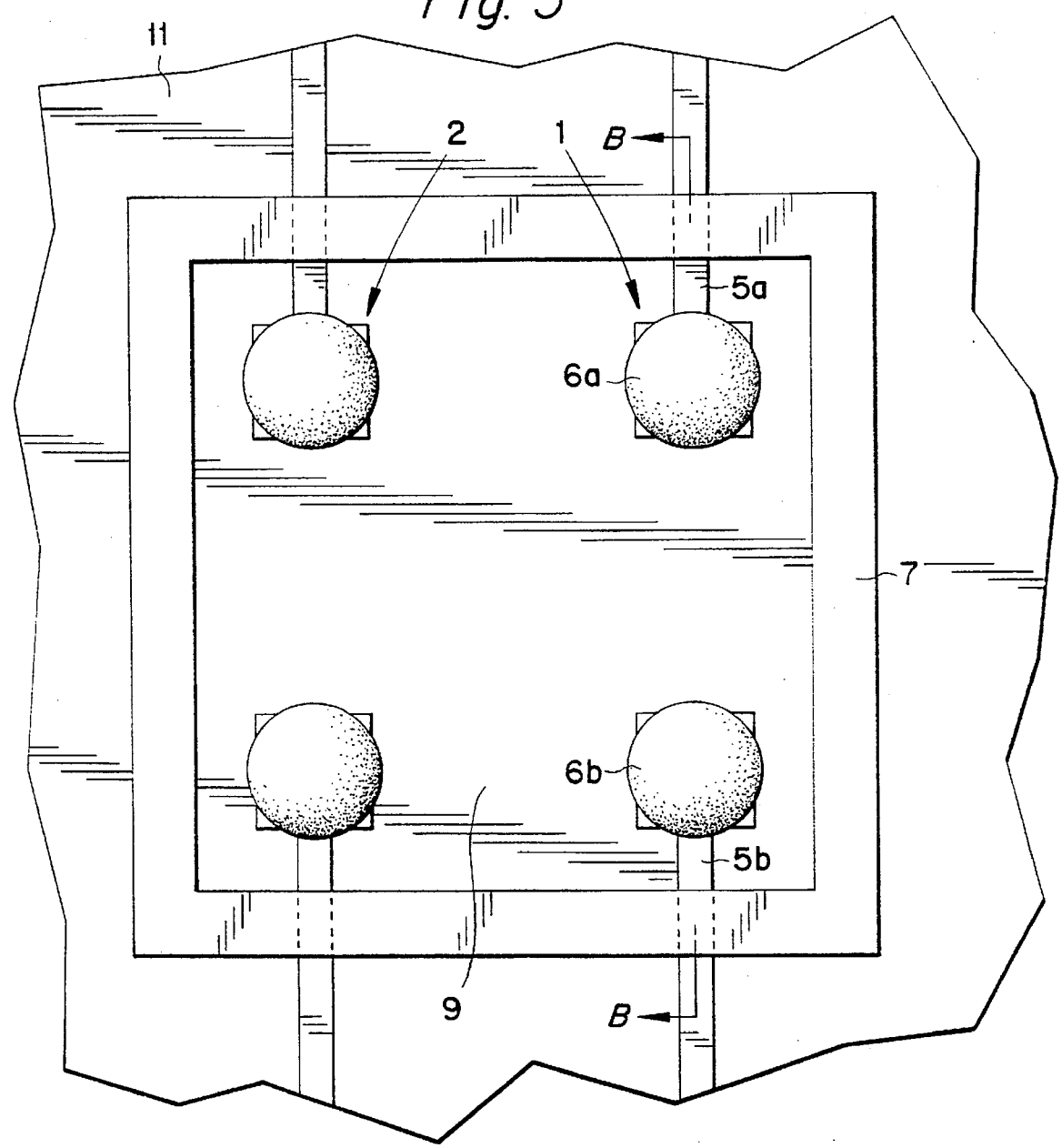
FIG. 3 illustrates from above the fuse arrangement according to FIG. 1 after initiation of the safety function.

FIG. 3 illustrates the fuse arrangement of FIG. 1 subsequent to the safety function coming into effect. When current flows through the fuse, heat is generated in the substrate 11 as a result of the resistance in the current-conducting paths leading to the connection terminals and the solder. If this current is sufficiently high for a sufficiently long period of time, the substrate 11 will become so hot as to heat the solder 3 to an extent at which the solder will melt and contract to form solder spheres 6a, 6b on the connection terminals 4a, 4b, wherewith the current path is broken and the desired safety function is obtained. Although FIG. 3 shows the solder spheres 6a and 6b to be of mutually the same size, it will be understood that in practice the solder spheres 6a and 6b are not always the same size and are not as symmetrical as shown in FIG. 3.

A simple explanation of why the solder contracts is because the surface tension draws the solder material to the connection terminals as a result of the solder wetting said terminals.

Figure 4:
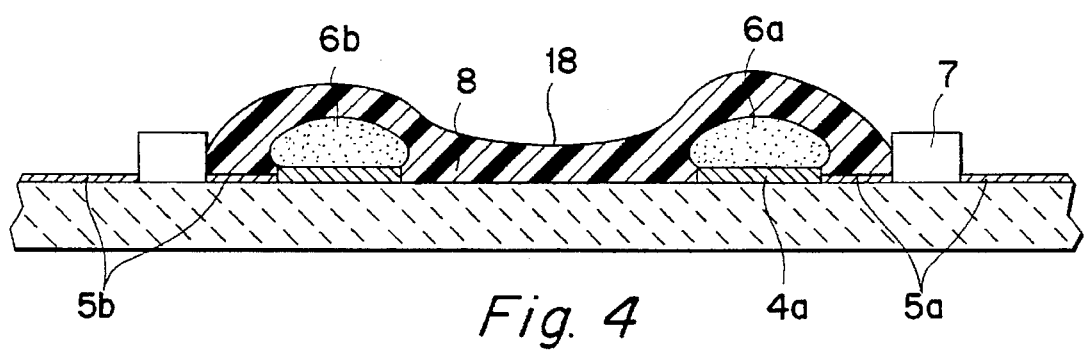
FIG. 4 is a sectional view of the fuse arrangement shown in FIG. 3, taken on the line B—B in FIG. 3.

FIG. 4 is a sectional view of the fuse arrangement shown in FIG. 3, taken on the line B—B in FIG. 3. FIG. 2 shows the fuse covered completely with material 8, with a relatively good margin. It is important that the layer thickness of the deposited material 8 is sufficient for the material to effectively cover the whole of the fuse. When the safety function of the fuse enters into effect and the solder contracts onto the connection terminals, the material 8 will be deformed, as indicated by the curve 18 shown in FIG. 4.

Figure 5:
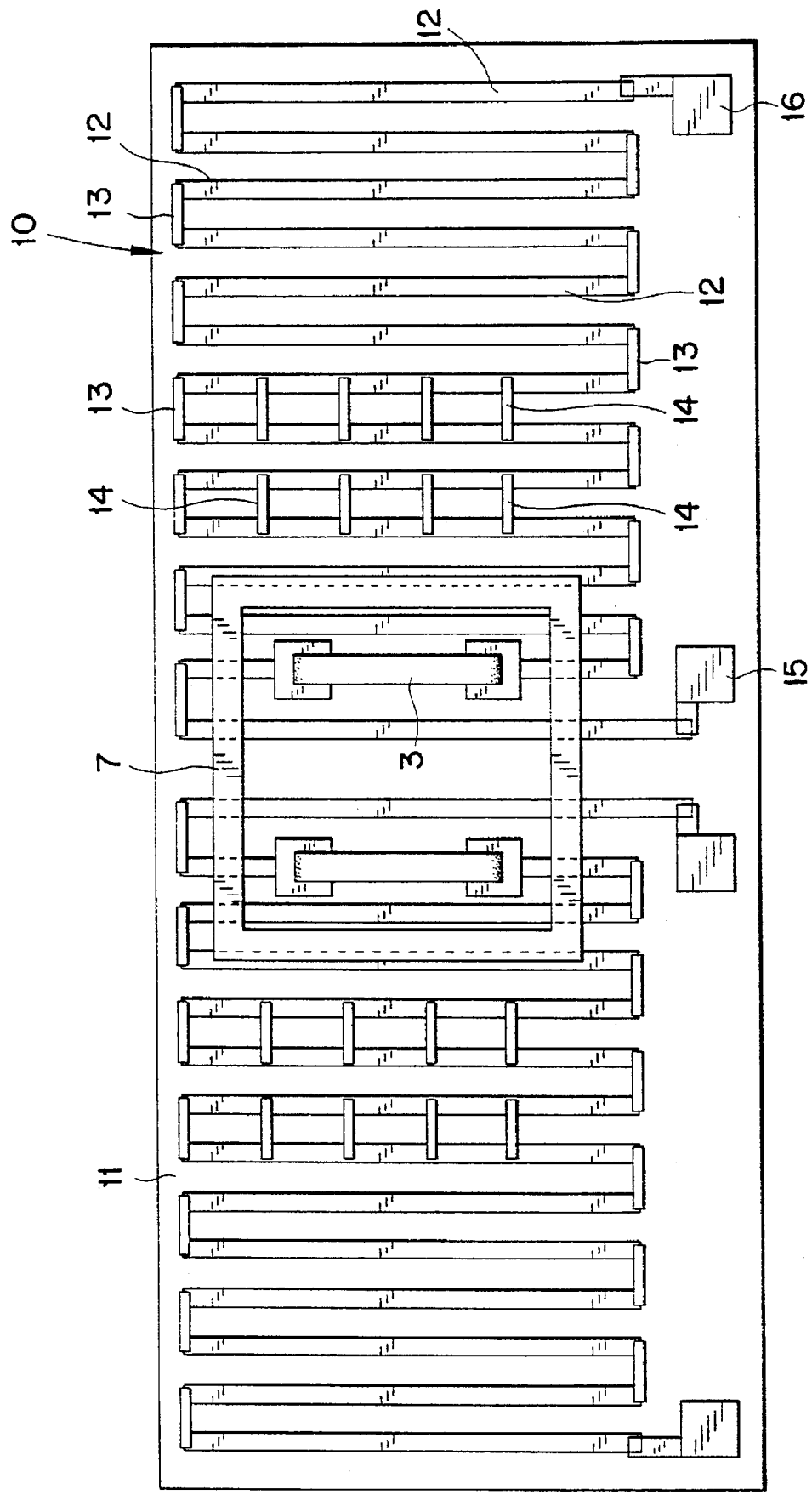
FIG. 5 illustrates an inventive protective circuit which includes the fuse arrangement shown in FIG. 1 and a resistance loop connected in series with the fuse, which protects against induced pulses.

FIG. 5 illustrates an alternative embodiment of the invention. In this case, in addition to comprising the fusible cut-out illustrated in FIG. 1, the arrangement also includes a resistance loop 10 which is mounted on the substrate 11 and which together with the fusible cut-out forms an electric protective circuit. The fusible cut-out and the resistance loop are duplicated in the Figure for the same reason as that mentioned earlier, i.e. because such an arrangement is appropriate for use in the context of telephony in order to protect a telephone line which includes two physical conductors. In the case of the FIG. 5 embodiment, the fusible cut-out shown in FIG. 1 is connected in series with the resistance loop 10 so as to provide a protective circuit whose ends are connected to connection terminals 15 and 16 respectively. The resistance loop 10 functions to protect against induced pulses, for instance lightning-induced pulses. The fuse arrangement also includes the fuse 1 shown in FIG. 1, which as before mentioned is a fusible cut-out fuse which breaks the current path when the substrate 11 is heated sufficiently. This embodiment thus includes the aforedescribed fusible cut-out and also a protective function in the form of a resistance loop.

The resistance loop 10 includes current-conducting paths which have a given desired resistance, for instance a resistance of 20 ohms. The current-conducting paths extend in one plane and do not intersect one another. The resistance loop 10 absorbs the energy contained by the pulses that enter into one end of the loop 10.

The resistance loop 10 includes a plurality of current-conducting paths 12 which are connected to bridging elements 13 at respective ends, so as to obtain a coherent loop. The current-conducting paths form the actual resistance. In order to avoid current concentrations in the ends of the current-conducting paths 12, the resistance in the bridging elements 13 is much lower than the resistance in the current-conducting paths. When the resistance in the bridging elements 13 is equally as large as the resistance in the current-conducting paths 12, the current tends to concentrate in the corners between the paths 12 and the elements 13. The elements 13 therefore have a lower resistance than the paths 12, so that the current will be uniformly distributed when passing from one current-conducting path to another.

Some of the current-conducting paths 12 are also connected in pairs to one or more trimming elements 14, as shown in FIG. 5. The total resistance in the loop 10 between connecting terminals 16 and 15 can be adjusted by disengaging the requisite number of trimming elements 14. Trimming elements can be disengaged, or disconnected, simply by cutting them off. Trimming is effected partly to obtain a desired tolerance regarding the resistance in the resistance loop and partly to provide the resistance loop 10 with the same resistance as the corresponding other resistance loop in FIG. 5, so as to obtain the desired tolerance on the quotient between the resistances of the two resistance loops. For instance, the resistance in the loop 10 may be 20 ohms with a tolerance of 1%, and the quotient between the resistances of the two loops may be 1 with a tolerance of 0.1%. The trimming elements 14 are of the same type as the bridging elements 13.

The FIG. 5 embodiment functions as a protective circuit against overvoltages that can enter via the telephone lines. The circuit protects against lightening-induced pulses wherein the duration of the pulse is often less than 1 millisecond and the peak voltage is most often less than 2,500 volts, and partly against internal short-circuiting of the telecommunication system supply voltage of 50 volts. These short circuits occur most often during a time period of some hours.

Since lightening-induced pulses are of short duration, there is no risk that there will be sufficient time for the fuse to become heated to such an extent as to melt the solder 3 and therewith trigger its safety function.

The fuse and the protective circuit can be readily integrated on a circuit board and have very small dimensions. The fuse 1 can be readily produced with a width of 1 mm and a length of 3 mm. The loop 10 occupies slightly more space, but can also be made very small. The fuse and the protective circuit are well suited for batch manufacture.

Since the fuse and the protective circuit are duplicated and since two fuses and two protective circuits are required for each telephone line, the inventive fuse and protective circuit can be used advantageously in line interface boards in telecommunications systems.

The substrate 11 may be comprised of a ceramic material. A suitable material in this regard is a ceramic substrate that contains 90–100% aluminium oxide.

It will be understood that the invention is not restricted to the aforedescribed and illustrated exemplifying embodiments thereof and that modifications can be made within the scope of the following claims.

What is claimed is:

1. An electric protective circuit, comprising:
   an electric fuse mounted on a substrate, the fuse including a solder that is connected as a resistance in a current series circuit between connection terminals and that will melt at elevated temperatures caused by heating of the substrate;
   an electric resistance loop connected in series with the fuse and mounted on the substrate, the resistance loop including current-conducting paths mutually connected with bridging elements, and trimming elements for adjusting a resistance of the resistance loop, an electrical resistance of the bridging elements being much lower than an electrical resistance of the current-conducting paths;
   a material applied in a region surrounding the solder, wherein the material surrounds and completely covers the solder and protects the solder against oxidation by surrounding air both at room temperature and at an elevated temperature, thereby enabling the solder to contract onto the connection terminals when it melts and break a current path; the material is temperature-stable in a solid state at normal fuse operating temperatures and comprises at least one substance taken from a group comprising waxes, resins, thermoplastics, and synthetic fluxes; and the region surrounding the solder is delimited by barrier walls that prevent the material from running away from the region.

2. The protective circuit of claim 1, wherein the material surrounding the solder is a thermoplastic material with a base of ethylene vinyl acetate.

3. The protective circuit of claim 1, in which the resistance loop and the fuse are duplicated and resistive values of the duplicated resistance loops are adjusted by the trimming elements so that the resistance values are substantially the same.

4. The protective circuit of claim 1, wherein the applied material surrounding the solder has a weak flux enabling breakdown of any oxide that is formed on the solder at room temperature.

5. The protective circuit of claim 1, wherein when the substrate temperature becomes hot enough to melt the solder, the solder will contract and form spheres on the connection terminals thereby breaking the current path.

* * * * *